(12) United States Patent
Landis et al.

(10) Patent No.: US 7,001,482 B2
(45) Date of Patent: Feb. 21, 2006

(54) METHOD AND APPARATUS FOR IMPROVED FOCUS RING

(75) Inventors: Michael Landis, Gilbert, AZ (US);
Steven T Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/705,221

(22) Filed: Nov. 12, 2003

(65) Prior Publication Data

US 2005/0099135 A1    May 12, 2005

(51) Int. Cl.
C23F 1/02     (2006.01)
C25D 3/38     (2006.01)
C23C 16/00    (2006.01)

(52) U.S. Cl. ............... 156/345.55; 156/345.51; 156/345.54; 204/298.28; 204/298.23; 118/730; 118/728

(58) Field of Classification Search ........... 156/345, 156/345.55, 345.54, 345.51; 204/298, 298.28, 204/298.23; 118/715, 723, 730, 729, 728; 315/111.71, 111

See application file for complete search history.

(56) References Cited

U.S. PATENT DOCUMENTS

| | | | |
|---|---|---|---|
| 5,556,500 A | | 9/1996 | Hasegawa et al. |
| 6,815,352 B1 * | | 11/2004 | Tamura et al. ............... 438/691 |
| 6,837,966 B1 * | | 1/2005 | Nishimoto et al. ..... 156/345.29 |
| 2001/0015262 A1 | | 8/2001 | Denpoh |
| 2002/0072240 A1 | | 6/2002 | Koike |
| 2004/0125360 A1 * | | 7/2004 | Ludviksson et al. ........... 356/72 |

* cited by examiner

*Primary Examiner*—Tuyet Thi Vo
(74) *Attorney, Agent, or Firm*—Pillsbury Winthrop Shaw Pittman LLP

(57) ABSTRACT

A focus ring assembly, configured to be coupled to a substrate holder in a plasma processing system, comprises a focus ring having one or more wear indicators for determining the lifetime of the focus ring, wherein the coupling of the focus ring to the substrate holder facilitates auto-centering of the focus ring in the plasma processing system. For example, a centering ring mounted on the substrate holder can comprise a centering feature configured to couple with a mating feature on the focus ring.

16 Claims, 9 Drawing Sheets

METHOD AND APPARATUS FOR IMPROVED FOCUS RING

FIELD OF THE INVENTION

The present invention relates to a method and apparatus for utilizing a focus ring in a plasma processing system and, more particularly, to a focus ring assembly that facilitates improved maintenance of the plasma processing system.

BACKGROUND OF THE INVENTION

The fabrication of integrated circuits (IC) in the semiconductor industry typically employs plasma to create and assist surface chemistry within a vacuum processing system necessary to remove material from and deposit material to a substrate. In general, plasma is formed within the processing system under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the system (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the processing system can lead to a gradual degradation of the plasma processing performance and ultimately to complete failure of the system.

Therefore, in order to minimize the damage sustained by exposure to the processing plasma, a consumable or replaceable component, such as one fabricated from silicon, quartz, alumina, carbon, or silicon carbide, can be inserted within the processing chamber to protect the surfaces of more valuable components that would impose greater costs during frequent replacement and/or to affect changes in the process. Furthermore, it is desirable to select surface materials that minimize the introduction of unwanted contaminants, impurities, etc. to the processing plasma and possibly to the devices formed on the substrate. Often times, these consumables or replaceable components are considered part of the process kit, which is frequently maintained during system cleaning.

SUMMARY OF THE INVENTION

A method and apparatus for utilizing a focus ring in a plasma processing system is described.

According to one aspect, a focus ring assembly for surrounding a substrate on a substrate holder in a plasma processing system comprises a centering ring configured to be coupled to the substrate holder and a focus ring comprising an upper surface, a lower surface, and one or more wear indicators coupled to at least one of the upper surface and the lower surface, wherein the focus ring is configured to be centered about the substrate by coupling the focus ring to the centering ring.

According to another aspect, a disposable focus ring for surrounding a substrate on a substrate holder in a plasma processing system comprises a ring configured to be coupled to the substrate holder comprising an upper surface, a lower surface, and one or more wear indicators coupled to at least one of the upper surface and the lower surface, wherein the ring is configured to be centered about the substrate by coupling the ring to the substrate holder.

Additionally, a method of replacing a focus ring surrounding a substrate on a substrate holder in a plasma processing system comprises removing a first focus ring from the plasma processing system and installing a second focus ring in the plasma processing system by coupling the second focus ring to the substrate holder. The coupling facilitates auto-centering of the second focus ring in the plasma processing system, wherein the first focus ring and the second focus ring each comprise an upper surface, a lower surface, and one or more wear indicators coupled to at least one of the upper surface and the lower surface.

DETAILED DESCRIPTION OF SEVERAL EMBODIMENTS

In plasma processing, a focus ring can, for example, be configured to surround a substrate on a substrate holder, and be employed to adjust and/or control the properties of the process chemistry local to the peripheral edge of the substrate. For conventional plasma processing systems, the focus ring comprises a ring of silicon, for instance for oxide etching, that rests atop the substrate holder and surrounds the substrate periphery.

Figure 1:
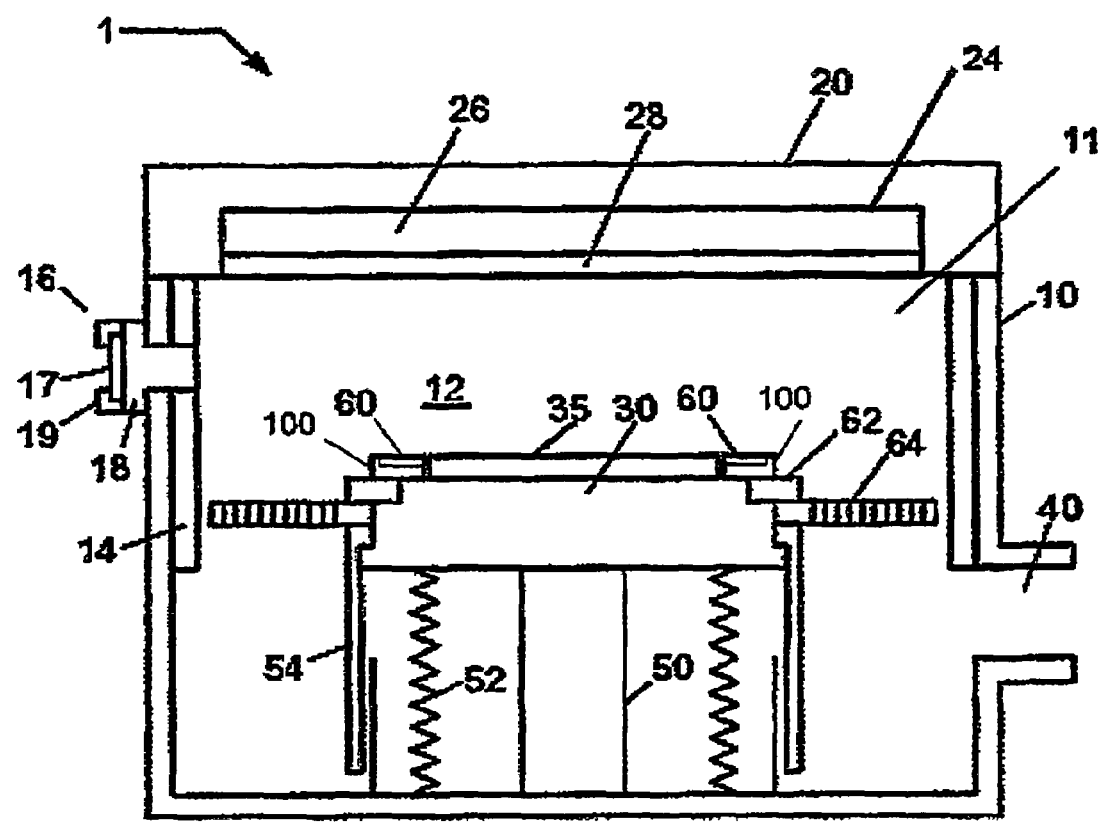
FIG. 1 illustrates a schematic block diagram of a plasma processing system according to an embodiment of the present invention.

According to an embodiment of the present invention, a plasma processing system 1 is depicted in FIG. 1 comprising a plasma processing chamber 10, an upper assembly 20, an electrode plate assembly 24, a substrate holder 30 for supporting a substrate 35, and a pumping duct 40 coupled to a vacuum pump (not shown) for providing a reduced pressure atmosphere 11 in plasma processing chamber 10.

Plasma processing chamber 10 can facilitate the formation of a processing plasma in process space 12 adjacent substrate 35. The plasma processing system 1 can be configured to process substrates of any size, such as 200 mm substrates, 300 mm substrates, or larger.

In the illustrated embodiment, electrode plate assembly 24 comprises an electrode plate 26 (FIG. 1) and an electrode 28 (FIG. 1). In an alternate embodiment, upper assembly 20 can comprise at least one of a cover, a gas injection assembly, and an upper electrode impedance match network. The electrode plate assembly 24 can be coupled to an RF source. In another alternate embodiment, the upper assembly 20 comprises a cover coupled to the electrode plate assembly 24, wherein the electrode plate assembly 24 is maintained at an electrical potential equivalent to that of the plasma processing chamber 10. For example, the plasma processing chamber 10, the upper assembly 20, and the electrode plate assembly 24 can be electrically connected to ground potential.

Plasma processing chamber 10 can further comprise an optical viewport 16 coupled to a deposition shield 14. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can permit monitoring of optical emission from the processing plasma in process space 12.

Substrate holder 30 can further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can be coupled to the substrate holder 30 and configured to protect the bellows 52 from the processing plasma. Substrate holder 30 can further be coupled to at least one of a focus ring 60, and a shield ring 62. Furthermore, a baffle plate 64 can extend about a periphery of the substrate holder 30.

Substrate 35 can be transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be affixed to the substrate holder 30 via an electrostatic clamping system. Furthermore, substrate holder 30 can further include a cooling system including a re-circulating coolant flow that receives heat from substrate holder 30 and transfers heat to a heat exchanger system (not shown), or when heating, transfers heat from the heat exchanger system. Moreover, gas can be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from about 1 MHz to about 100 MHz, for example, about 13.56 MHz. RF systems for plasma processing are well known to those skilled in the art.

Alternately, the processing plasma in process space 12 can be formed using a parallel-plate, capacitively coupled plasma (CCP) source, an inductively coupled plasma (ICP) source, any combination thereof, and with and without magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
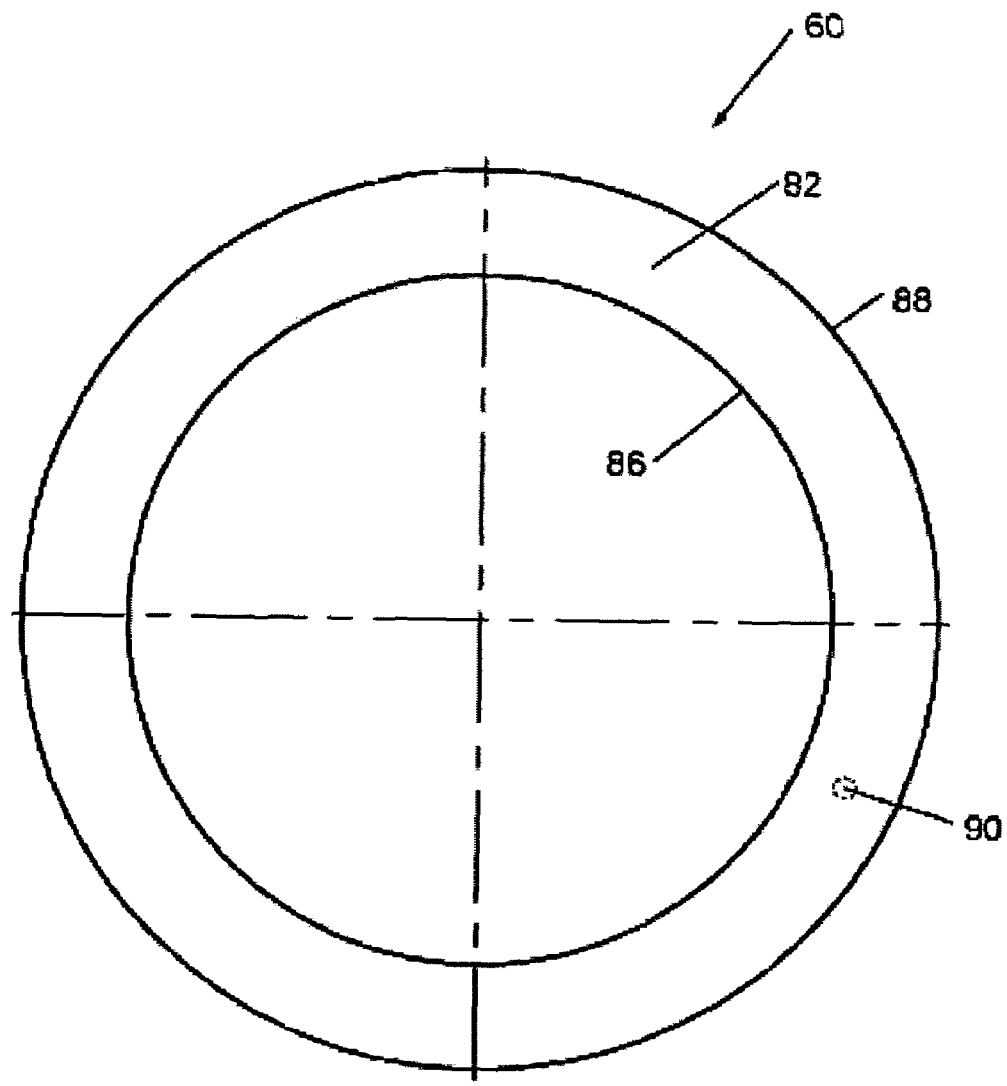
FIG. 2 presents a plan view of a focus ring according to an embodiment of the present invention.
Figure 3:
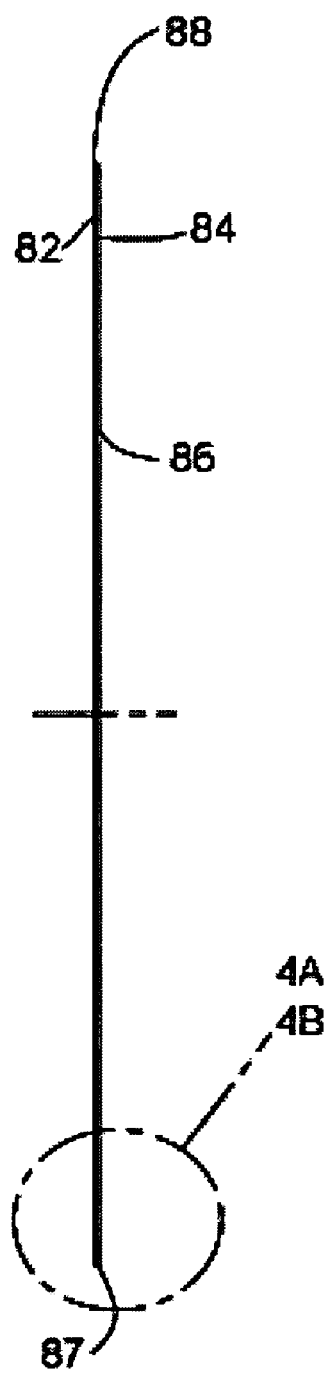
FIG. 3 presents cross-sectional view of the focus ring depicted in FIG. 2.

Referring now to an illustrated embodiment of the present invention depicted in FIG. 2 (top plan view), and FIG. 3 (cross sectional view), focus ring 60 can form a ring comprising an upper surface 82, a lower surface 84, an inner radial edge 86, and an outer radial edge 88. The focus ring 60 can be formed from at least one of silicon, quartz, silicon carbide, silicon nitride, carbon, alumina, sapphire, Teflon, and polyimide. The focus ring 60 can have a thickness ranging from about 0.5 to about 10 mm. Alternatively, the thickness can range from about 1 to about 5 mm, or the thickness can be approximately 1 mm. The focus ring 60 can, for example, be fabricated using at least one of machining, laser-cutting, grinding, and polishing.

Figure 4A:
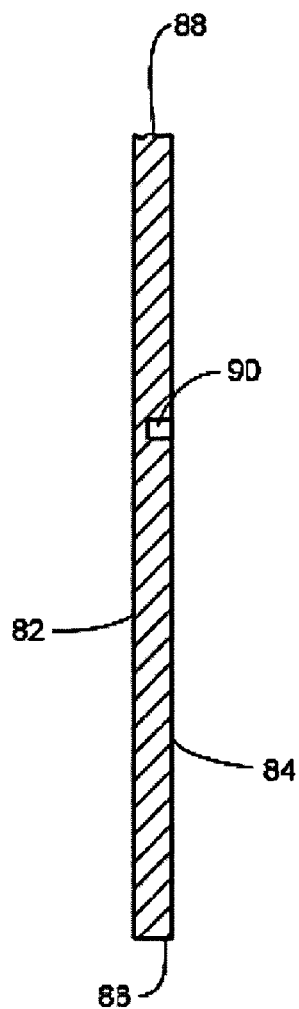
FIG. 4A presents an expanded cross-sectional view of the focus ring depicted in FIG. 2.
Figure 4B:
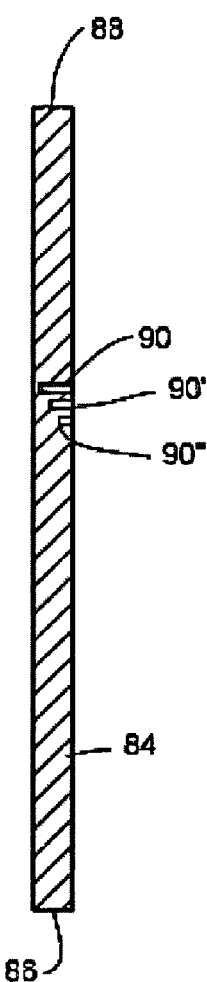
FIG. 4B presents another expanded cross-sectional view of a focus ring like the one depicted in FIG. 2.

FIG. 4A and FIG. 4B provide an expanded cross-sectional view of the focus ring 60, wherein the focus ring 60 comprises at least one wear indicator 90 coupled to the lower surface 84 and configured to indicate the extent of consumption of the focus ring during processing. Alternately, the focus ring 60 comprises at least one wear indicator 90 coupled to the upper surface 82 and configured to indicate the extent of consumption of the focus ring during processing. For example, FIG. 4A depicts a wear indicator 90 having a constant length and width. Alternatively, FIG. 4B depicts several wear indicators 90, 90', 90'', each having a different length, and/or different width.

Figure 5A:
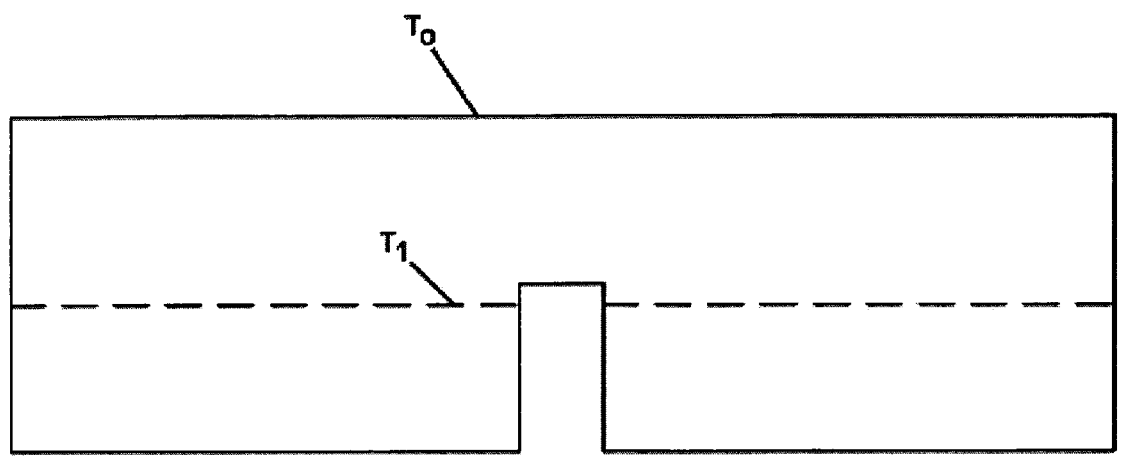
FIG. 5A illustrates the evolution of a wear indicator during processing according to one embodiment of the present invention.
Figure 5B:
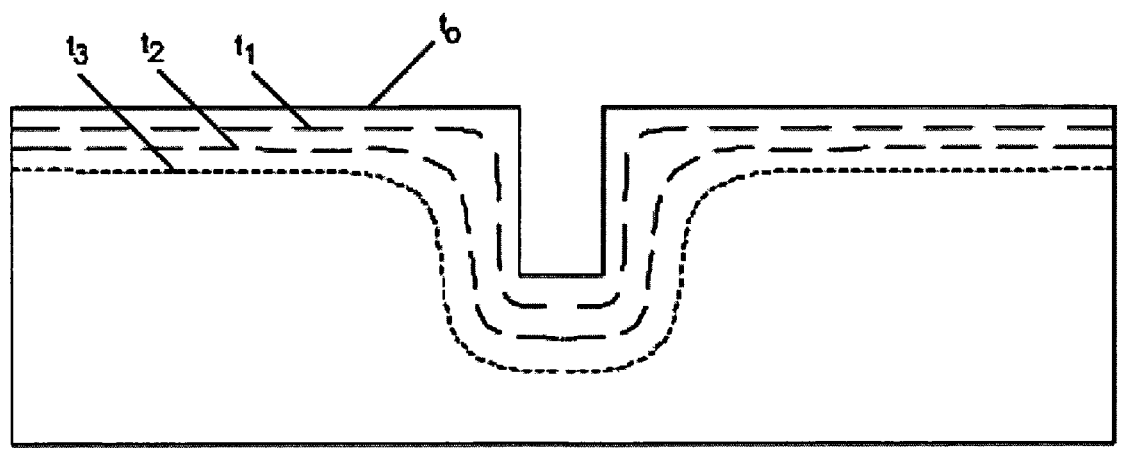
FIG. 5B illustrates the evolution of a wear indicator during processing according to another embodiment of the present invention.

Referring now to FIG. 5A, when the one or more wear indicators 90 are coupled to lower surface 84 of focus ring 60, each wear indicator 90 is not exposed to the processing environment until a process time (i.e., $T_1-T_0$) has elapsed that is sufficiently long for the upper surface 82 (that is exposed to the processing environment) to erode to a depth intersecting with the wear indicator. Once the wear indicator 90 is exposed and is now visible from the upper surface 82 of focus ring 60, the focus ring 60 can be scheduled for replacement. This observation can be made from run-to-run, while monitoring the focus ring 60 through the optical window 17. Alternatively, as shown in FIG. 5B, when the one or more wear indicators 90 are coupled to upper surface 82 of focus ring 60, each wear indicator 90 is exposed to the processing environment and, hence, subject to erosion, wherein both the lateral and longitudinal extent of erosion increases from time $t_0$ to $t_1$, $t_2$, $t_3$, etc. Once the wear indicator 90 has expanded to a pre-determined size, the focus ring 60 can be scheduled for replacement. This observation can be made from run-to-run, while monitoring the focus ring 60 through the optical window 17.

Additionally, wear indicators 90 can be placed at different radial locations on the focus ring 60 in order to observe radial variations in the consumption of the focus ring 60. Alternatively, wear indicators can be placed at different azimuthal locations on the focus ring 60 in order to observe azimuthal variations in the consumption of the focus ring 60. A wear indicator 90 can have a length ranging from about 1 to about 5 mm. Alternatively, the length can range from about 0.25 to about 1 mm, or the length can be approximately 0.5 mm. Alternately, a wear indicator 90 can be a fraction of the thickness of focus ring 60 within a fractional range from about 10 to about 90%. Alternatively, the fraction of the focus ring thickness can have a fractional range from about 25 to about 75%, or the fraction of the focus ring thickness can be approximately 50%. The one or more wear indicators can, for example, be fabricated using at least one of machining, etching, laser-milling, and sonic-milling.

Figure 6:
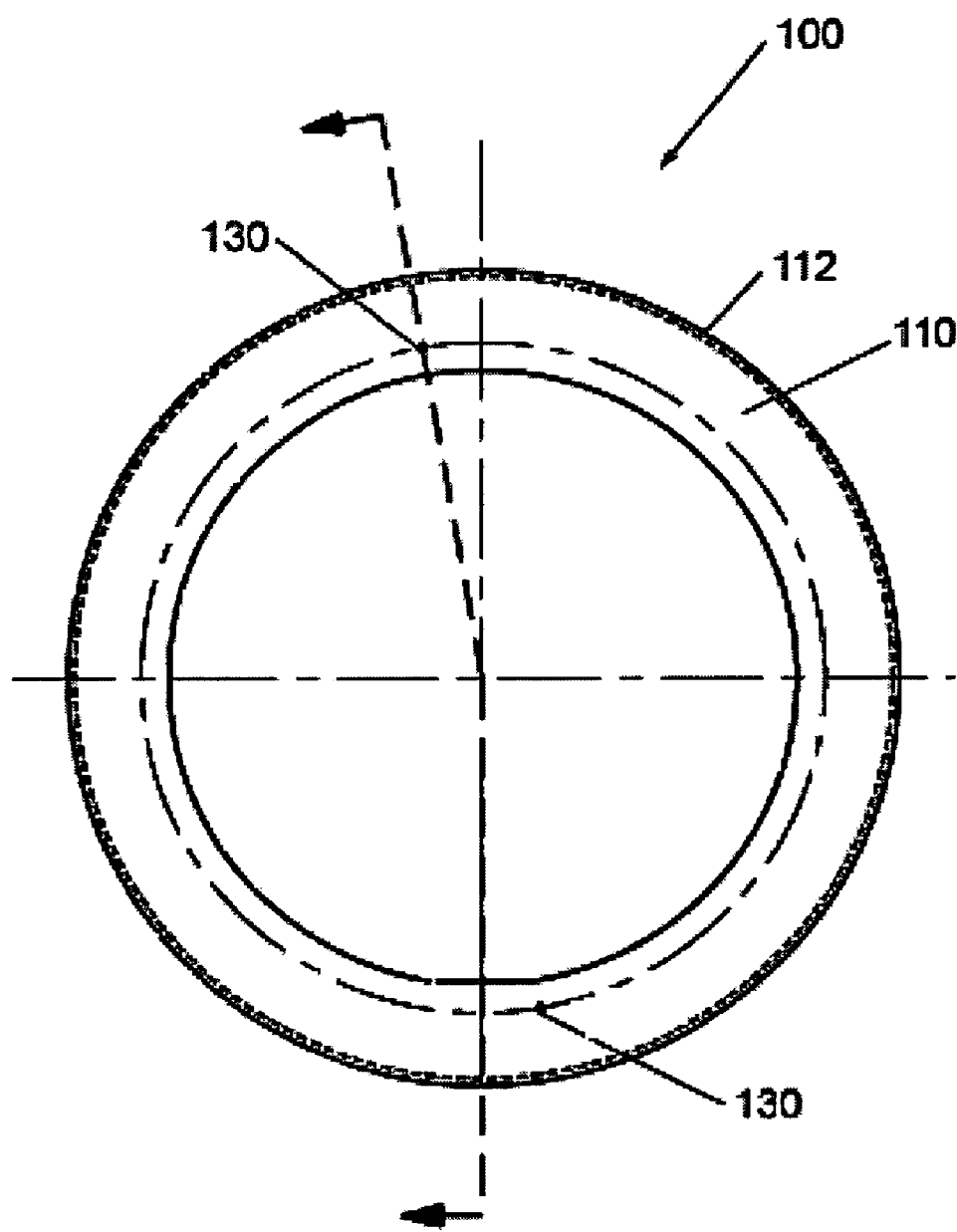
FIG. 6 presents a plan view of a centering ring according to an embodiment of the present invention.
Figure 7:
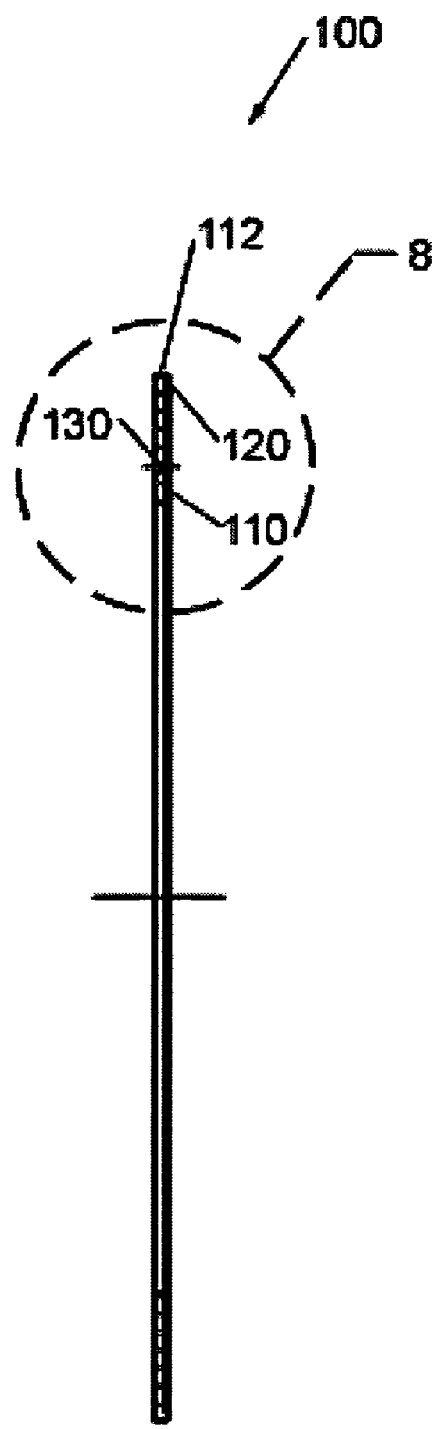
FIG. 7 presents a cross-sectional view of the centering ring depicted in FIG. 5.
Figure 8:
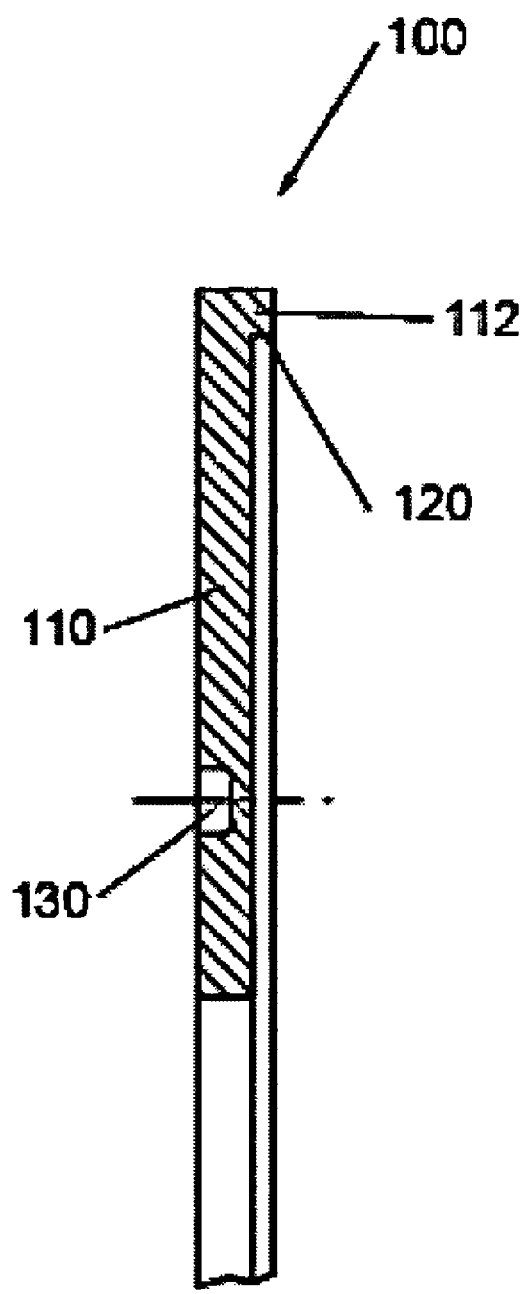
FIG. 8 presents an expanded cross-sectional view of the centering ring depicted in FIG. 7.

According to an embodiment of the present invention, focus ring 60 can be automatically centered on a substrate holder by coupling a mating feature on the focus ring with a centering feature on the substrate holder. For example, the mating feature on focus ring 60 comprises a mating surface 87 on the outer radial edge 86 (see FIG. 3). Additionally, the centering feature on the substrate holder can comprise a centering ring coupled to the substrate holder. FIG. 6 presents a plan view of a centering ring 100, FIG. 7 presents a cross-sectional view of the centering ring 100, and FIG. 8 presents an expanded cross-sectional view of the centering ring 100. The centering ring 100 can comprise a flange region 110, and a lip region 112, wherein the lip region 112 further comprises a centering surface 120. The centering surface 120 can, for example, comprise a radial surface as shown in FIGS. 6, 7, and 8, wherein a radial locational clearance fit is provided between the mating surface 87 and the centering surface 120 upon coupling of the focus ring 60 to the centering ring 100.

Referring still to FIGS. 6 through 8, centering ring 100 can further comprise two or more locating features 130, such as two holes, for coupling the centering ring 100 to the substrate holder. The centering ring 100 can rest atop the substrate holder. Alternatively, the centering ring 100 can be mechanically clamped to the substrate holder using at least one of a clamp ring and a fastener. Alternately, the centering ring 100 can be electrically clamped to the substrate holder using an electrostatic clamping (ESC) system.

The centering ring 100 can be made from at least one of aluminum, coated aluminum, silicon, quartz, silicon carbide, silicon nitride, carbon, alumina, sapphire, Teflon, and polyimide. For coated aluminum, the coating can, for instance, facilitate the provision of an erosion resistant surface when the centering ring 100 is exposed to harsh processing environments, such as plasma. During fabrication, one or more surfaces can be anodized, one or more surfaces can have a coating sprayed on, or one or more surfaces can be subjected to plasma electrolytic oxidation. The coating can include at least one of a III-column element and a Lanthanon element, for example. The coating can comprise at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$. Methods of anodizing aluminum components and applying spray coatings are well known to those skilled in the art of surface material treatment.

Figure 9:
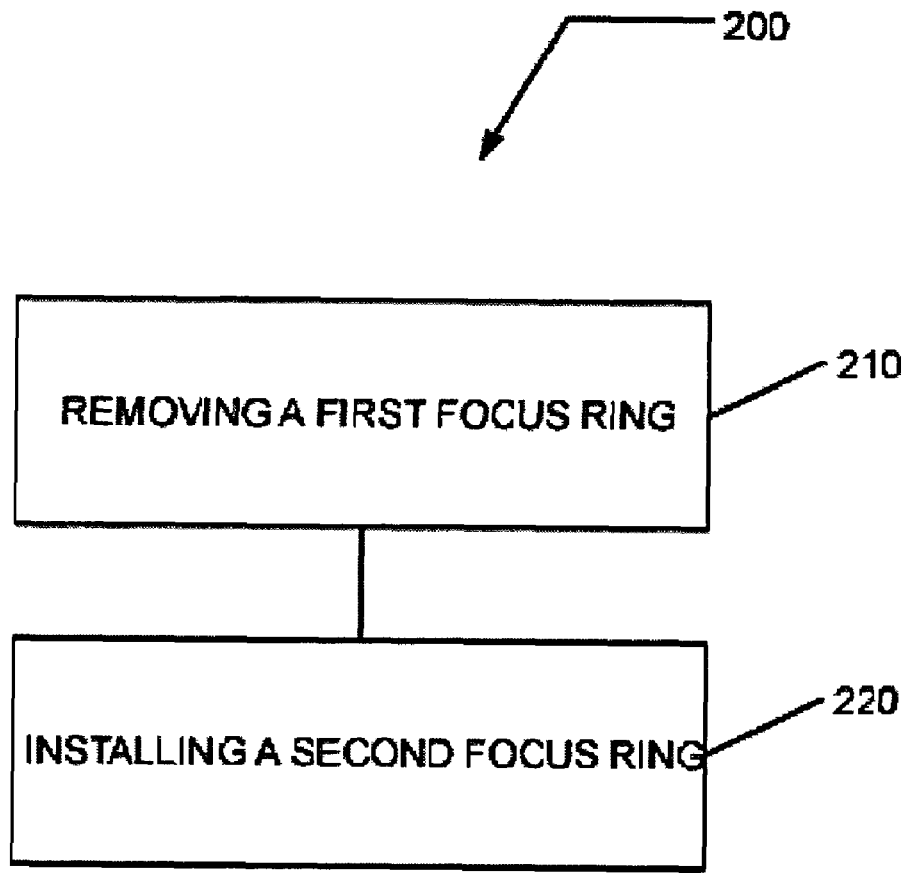
FIG. 9 presents a method of replacing a focus ring surrounding a substrate in a plasma processing system.

Referring now to FIG. 9, a method for replacing a focus ring surrounding a substrate on a substrate holder in a plasma processing system is described. The method comprises a flow chart 200 beginning in 210 with removing a first focus ring from the plasma processing system, wherein the focus ring comprises an upper surface, a lower surface, and one or more wear indicators coupled to at least one of the upper surface and the lower surface. Removing the first focus ring can, for example, comprise venting the plasma processing system to atmospheric conditions and opening the plasma processing chamber to access the interior, followed by decoupling the focus ring from the substrate holder. Decoupling the focus ring from the substrate holder can, for example, comprise lifting the focus ring away from the substrate holder, or de-clamping the focus ring from the substrate holder and then lifting the focus ring away from the substrate holder.

In 220, a second focus ring is installed in the plasma processing system by coupling the second focus ring to the substrate holder, wherein the coupling facilitates auto-centering of the second focus ring in the plasma processing system. The second focus ring can comprise the first focus ring following refurbishing, or it can be a newly fabricated focus ring having an upper surface, a lower surface, and one or more wear indicators coupled to at least one of said upper surface and said lower surface. Auto-centering of the second focus ring in the plasma processing system can be achieved, as described above, by providing a mating surface on an outer radial edge of the focus ring, and coupling the mating surface to a centering surface on a lip region of a centering ring mounted on the substrate holder. Alternately, auto-centering of the second focus ring in the plasma processing system can be achieved by providing two or more pins mounted on a contact surface on the focus ring, and coupling the pins on the focus ring to two or more receiving holes on a receiving surface of the centering ring. Alternatively, the two or more pins can be located on the centering ring, and the two or more receiving holes can be located on the focus ring.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A focus ring assembly for surrounding a substrate on a substrate holder in a plasma processing system comprising:
    a centering ring configured to be coupled to said substrate holder; and
    a focus ring comprising an upper surface, a lower surface, and one or more wear indicators coupled to at least one of said upper surface and said lower surface, wherein said focus ring is configured to be centered about said substrate by coupling said focus ring to said centering ring.

2. A disposable focus ring for surrounding a substrate on a substrate holder in a plasma processing system comprising:
    a ring configured to be coupled to said substrate holder comprising an upper surface, a lower surface, and one or more wear indicators coupled to at least one of said upper surface and said lower surface,
    wherein said ring is configured to be centered about said substrate by coupling said ring to said substrate holder, and
    wherein said one or more wear indicators comprise a hole in said upper surface or lower surface and extending to a depth from said upper surface or said lower surface, said depth comprising a fraction of the distance between said upper surface and said lower surface.

3. A method of replacing a focus ring surrounding a substrate on a substrate holder in a plasma processing system comprising:

removing a first focus ring from said plasma processing system; and installing a second focus ring in said plasma processing system by coupling said second focus ring to said substrate holder, said coupling facilitating auto-centering of said second focus ring in said plasma processing system, wherein said first focus ring and said second focus ring each comprise an upper surface, a lower surface, and one or more wear indicators coupled to at least one of said upper surface and said lower surface, and wherein said one or more wear indicators comprise a hole in said upper surface or lower surface and extending to a depth from said upper surface or said lower surface, said depth comprising a fraction of the distance between said upper surface and said lower surface.

4. A focus ring assembly for surrounding a substrate on a substrate holder in a plasma processing system comprising:

a centering ring configured to be coupled to said substrate holder; and a focus ring comprising an upper surface, a lower surface, and one or more wear indicators coupled to at least one of said upper surface and said lower surface, wherein said focus ring is configured to be centered about said substrate by coupling said focus ring to said centering ring, wherein said centering ring is coupled to said substrate holder by at least one of said centering ring resting atop said substrate holder, said centering ring being mechanically clamped to said substrate holder, and said centering ring being electrically clamped to said substrate holder.

5. The focus ring assembly of claim 4, wherein said focus ring is made from at least one of silicon, quartz, silicon carbide, silicon nitride, amorphous carbon, alumina, sapphire, polyimide, and Teflon.

6. The focus ring assembly of claim 4, wherein said one or more wear indicators comprises a hole in said upper surface and extending to a depth from said upper surface, said depth comprising a fraction of the distance between said upper surface and said lower surface.

7. The focus ring assembly of claim 4, wherein said one or more wear indicators comprise a hole in said lower surface and extending to a depth from said lower surface, said depth comprising a fraction of the distance between said upper surface and said lower surface.

8. The focus ring assembly of claim 6 or 7 wherein said depth for each of said one or more wear indicators varies from one wear indicator to another wear indicator.

9. The focus ring assembly of claim 4, wherein said centering ring comprises a centering feature configured to center said focus ring on said centering ring.

10. The focus ring assembly of claim 9, wherein said centering feature comprises at least one of a centering pin, a centering receptacle, and a centering edge.

11. The focus ring assembly of claim 9, wherein said focus ring comprises a mating feature configured to be coupled with said centering feature.

12. The focus ring assembly of claim 11, wherein said mating feature comprises at least one of a centering pin, a centering receptacle, and a centering edge.

13. The focus ring assembly of claim 4, wherein said centering ring is made from at least one of aluminum, coated aluminum, silicon, silicon carbide, silicon nitride, amorphous carbon, alumina, sapphire, polyimide, and Teflon.

14. The focus ring assembly of claim 13, wherein said centering ring is made from coated aluminum and comprises at least one of surface anodization, a plasma electrolytic oxidation coating, and a spray coating.

15. The focus ring assembly as recited in claim 13, wherein said centering ring is made from coated aluminum and comprises a coating having at least one of III-column element and a Lanthanon element.

16. The focus ring assembly as recited in claim 13, wherein said centering ring is made from coated aluminum and comprises a coating having at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$.

* * * * *